(12) United States Patent
Takagi

(10) Patent No.: US 6,529,791 B1
(45) Date of Patent: Mar. 4, 2003

(54) APPARATUS AND METHOD FOR PLACING A COMPONENT

(75) Inventor: Makoto Takagi, Funabashi (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/520,729

(22) Filed: Mar. 8, 2000

(30) Foreign Application Priority Data

Mar. 15, 1999 (JP) .......................................... 11-068004

(51) Int. Cl.⁷ ........................... G06F 19/00; G06F 17/50
(52) U.S. Cl. ............................ 700/121; 700/97; 703/1; 716/8; 716/9
(58) Field of Search ...................... 700/97, 121; 703/1; 716/8, 9

(56) References Cited

U.S. PATENT DOCUMENTS

| | | | | |
|---|---|---|---|---|
| 3,654,615 A | * | 4/1972 | Freitag .......................... | 716/9 |
| 5,406,498 A | * | 4/1995 | Yabe .............................. | 716/8 |
| 5,550,750 A | * | 8/1996 | Wolff ............................. | 716/10 |
| 5,781,446 A | * | 7/1998 | Wu ................................ | 716/8 |
| 6,118,937 A | * | 9/2000 | Iwasaki ......................... | 716/10 |
| 6,363,518 B1 | * | 3/2002 | Lee ............................... | 703/1 |

* cited by examiner

Primary Examiner—Maria N. Von Buhr
Assistant Examiner—Elliot Frank
(74) Attorney, Agent, or Firm—Joseph P. Abate

(57) ABSTRACT

Candidate locations in which each of the components is to be placed are assumed. Initially, all the cells on a printed circuit board are the candidates. The range of candidates for the location of each component is narrowed down in some way (for example, the farthest cell from a fixed component is excluded from candidates for the location in which a component that directly relates to the fixed component is to be placed). An approximation problem is created from an original placement problem and a solution that optimizes the approximation problem is find. This solution is a feasible solution of the original placement problem as well. The process of narrowing down the candidates and solving the approximation problem is repeated until one candidate (or more than one candidate having an equal evaluation value) is found ultimately to determine the placement of the component.

5 Claims, 19 Drawing Sheets

|  | FIX 1 | FIX 2 | FIX 3 |
|---|---|---|---|
| COMP 1 | 1 |  |  |
| COMP 2 |  |  |  |
| COMP 3 |  | 1 |  |
| COMP 4 |  |  | 1 |

|  | COMP 1 | COMP 2 | COMP 3 | COMP 4 |
|---|---|---|---|---|
| COMP 1 |  | 1 |  |  |
| COMP 2 | 1 |  | 1 | 1 |
| COMP 3 |  | 1 |  |  |
| COMP 4 |  | 1 |  |  |

CANDIDATE CELL FOR COMP 3
C3[3] = {2,3,4,5,6,8,9}

FIG.21

CANDIDATE CELL FOR COMP 4
C3[4] = {1,2,3,4,5,6}

FIG.22

CANDIDATE CELL FOR COMP 1
C3[1] = {4,5,6,7,8,9}

FIG.23

CANDIDATE CELL FOR COMP 2
C3[2] = {2,5}

| CELL 7 | CELL 8 | CELL 9 |
| CELL 4 | CELL 5 | CELL 6 |
| CELL 1 | CELL 2 | CELL 3 |

CANDIDATE CELL FOR COMP 3
C3[3] = {2,3,5,6,8,9}

| CELL 7 | CELL 8 | CELL 9 |
| CELL 4 | CELL 5 | CELL 6 |
| CELL 1 | CELL 2 | CELL 3 |

CANDIDATE CELL FOR COMP 4
C3[4] = {1,2,3,5}

| CELL 7 | CELL 8 | CELL 9 |
| CELL 4 | CELL 5 | CELL 6 |
| CELL 1 | CELL 2 | CELL 3 |

CANDIDATE CELL FOR COMP 4
C4[4] = {2}

| CELL 7 | CELL 8 | CELL 9 |
| CELL 4 | CELL 5 | CELL 6 |
| CELL 1 | CELL 2 | CELL 3 |

G5(4) → CELL 2 (shaded)

FIG.30

CANDIDATE CELL FOR COMP 1
C5[1] = {4,7,8}

| CELL 7 | CELL 8 | CELL 9 |
| CELL 4 | CELL 5 | CELL 6 |
| CELL 1 | CELL 2 | CELL 3 |

G6(1) → CELLS 7, 8, 4 (shaded)

FIG.31

CANDIDATE CELL FOR COMP 2
C5[2] = {5}

| CELL 7 | CELL 8 | CELL 9 |
| CELL 4 | CELL 5 | CELL 6 |
| CELL 1 | CELL 2 | CELL 3 |

G6(2) → CELL 5 (shaded)

FIG.32

CANDIDATE CELL FOR COMP 3
C5[3] = {4,7,8}

| CELL 7 | CELL 8 | CELL 9 |
| CELL 4 | CELL 5 | CELL 6 |
| CELL 1 | CELL 2 | CELL 3 |

G6(3) → (CELL 9, CELL 6 shaded)

FIG.33

CANDIDATE CELL FOR COMP 4
C5[4] = {2}

| CELL 7 | CELL 8 | CELL 9 |
| CELL 4 | CELL 5 | CELL 6 |
| CELL 1 | CELL 2 | CELL 3 |

G6(4) → (CELL 2 shaded)

FIG.34

CANDIDATE CELL FOR COMP 1
C6[1] = {7,8}

| CELL 7 | CELL 8 | CELL 9 |
| CELL 4 | CELL 5 | CELL 6 |
| CELL 1 | CELL 2 | CELL 3 |

G7(1) → (CELL 7, CELL 8 shaded)

FIG.35

CANDIDATE CELL FOR COMP 2
C6[2] = {5}

| CELL 7 | CELL 8 | CELL 9 |
|---|---|---|
| CELL 4 | CELL 5 | CELL 6 |
| CELL 1 | CELL 2 | CELL 3 |

G7(2) → CELL 5

FIG.36

CANDIDATE CELL FOR COMP 3
C6[3] = {6,9}

| CELL 7 | CELL 8 | CELL 9 |
|---|---|---|
| CELL 4 | CELL 5 | CELL 6 |
| CELL 1 | CELL 2 | CELL 3 |

CANDIDATE CELL FOR COMP 4
C6[4] = {2}

| CELL 7 | CELL 8 | CELL 9 |
|---|---|---|
| CELL 4 | CELL 5 | CELL 6 |
| CELL 1 | CELL 2 | CELL 3 |

…
APPARATUS AND METHOD FOR PLACING A COMPONENT

FIELD OF THE INVENTION

The present invention relates to an information processing method, and in particular, to an apparatus and method for optimal placement of components.

BACKGROUND ART

Conventionally, computers are used for determining the placement of components on a printed circuit board as described in, for example, Published Unexamined Application No. 09-181185. However, when the number of components is large or the correlation between components is complicated, the optimality of local component placement can affect the result of conventional methods, thus the computers often output, as an optimal value, a placement value that is lower than the optimal value.

As shown in FIG. 2, there are the following constraints in designing an integrated circuit (IC) 103:

(1) 16 or 32 pins 105 of the same size are provided, (2) the printed substrate by necessity has a connector 111 and the connector 111 also has pins, (3) connections between the IC pins 105 or between the IC pins 105 and the pins of connector 111 are determined by the logical design of the printed circuit board, (4) both of the top and back sides of the printed circuit board substrate are used for wiring 107 with only vertical wiring being printed on the top side and horizontal wiring on the back side, (5) a hole through the substrate is bored for wiring from the top side to the back side (or vice versa), and (6) conductors for wiring 107 are required to be spaced at a certain distance or over.

If components cannot be interconnected by wiring on the printed substrate, the substrate is fabricated without that wiring and the components are directly interconnected by soldering a conductor in a separate process (this connection is called the "jumper"). Since the manufacturing process increases by adding a jumper 109, the cost increases correspondingly. In addition, there occurs a problem that some wiring cannot be printed if the wiring is not proper.

SUMMARY OF THE INVENTION

It is an object of the present invention to provide component placement which reduces computational complexity as much as possible and provides a high evaluation value.

It is another object of the present invention to provide a system for determining the placement of components that provides a high evaluation value independently of the platform of a system to run.

In an aspect of the present invention, candidate locations in which each of the components is to be placed are assumed. Initially, all the cells on a printed circuit board are the candidates. The range of candidates for the location of each component is narrowed down (for example, the farthest cell from a fixed component is excluded from candidates for the location in which a component that directly relates to the fixed component is to be placed). An approximation problem is created from an original placement problem and a solution that optimizes the approximation problem is obtained. This solution is a feasible solution of the original placement problem as well. The process of narrowing down the candidates and solving the approximation problem is repeated until one candidate (or more than one candidate having an equal evaluation value) is found ultimately to determine the placement of the component.

BRIEF DESCRIPTION OF THE DRAWINGS

FIG. 21 shows a conceptual diagram for describing a calculation process of an optimal placement method according to a preferred embodiment of the present invention;

FIG. 22 shows a conceptual diagram for describing a calculation process of an optimal placement method according to a preferred embodiment of the present invention;

FIG. 23 shows a conceptual diagram for describing a calculation process of an optimal placement method according to a preferred embodiment of the present invention;

FIG. 24 shows a conceptual diagram for describing a calculation process of an optimal placement method according to a preferred embodiment of the present invention;

FIG. 25 shows a conceptual diagram for describing a calculation process of an optimal placement method according to a preferred embodiment of the present invention;

FIG. 26 shows a conceptual diagram for describing a calculation process of an optimal placement method according to a preferred embodiment of the present invention;

FIG. 30 shows a conceptual diagram for describing a calculation process of an optimal placement method according to a preferred embodiment of the present invention;

FIG. 31 shows a conceptual diagram for describing a calculation process of an optimal placement method according to a preferred embodiment of the present invention;

FIG. 32 shows a conceptual diagram for describing a calculation process of an optimal placement method according to a preferred embodiment of the present invention;

FIG. 33 shows a conceptual diagram for describing a calculation process of an optimal placement method according to a preferred embodiment of the present invention;

FIG. 34 shows a conceptual diagram for describing a calculation process of an optimal placement method according to a preferred embodiment of the present invention;

FIG. 35 shows a conceptual diagram for describing a calculation process of an optimal placement method according to a preferred embodiment of the present invention;

FIG. 36 shows a conceptual diagram for describing a calculation process of an optimal placement method according to a preferred embodiment of the present invention;

FIG. 37 shows a conceptual diagram for describing a calculation process of an optimal placement method according to a preferred embodiment of the present invention;

FIG. 38 shows a conceptual diagram for describing a calculation process of an optimal placement method according to a preferred embodiment of the present invention;

HARDWARE CONFIGURATION

Figure 1:
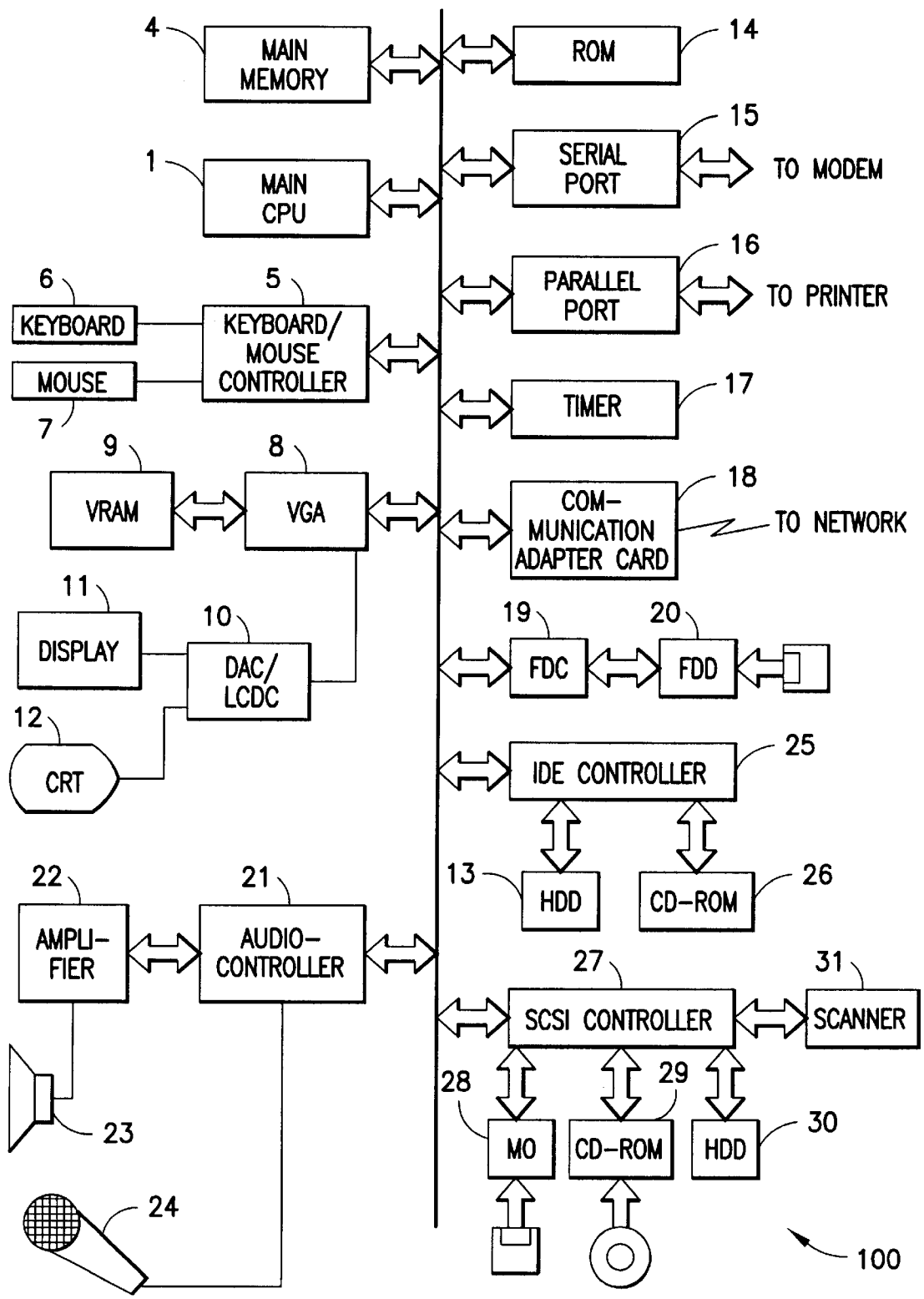
FIG. 1 shows an overview of an embodiment of a hardware configuration of an optimal component placement system of the present invention.
Figure 2:
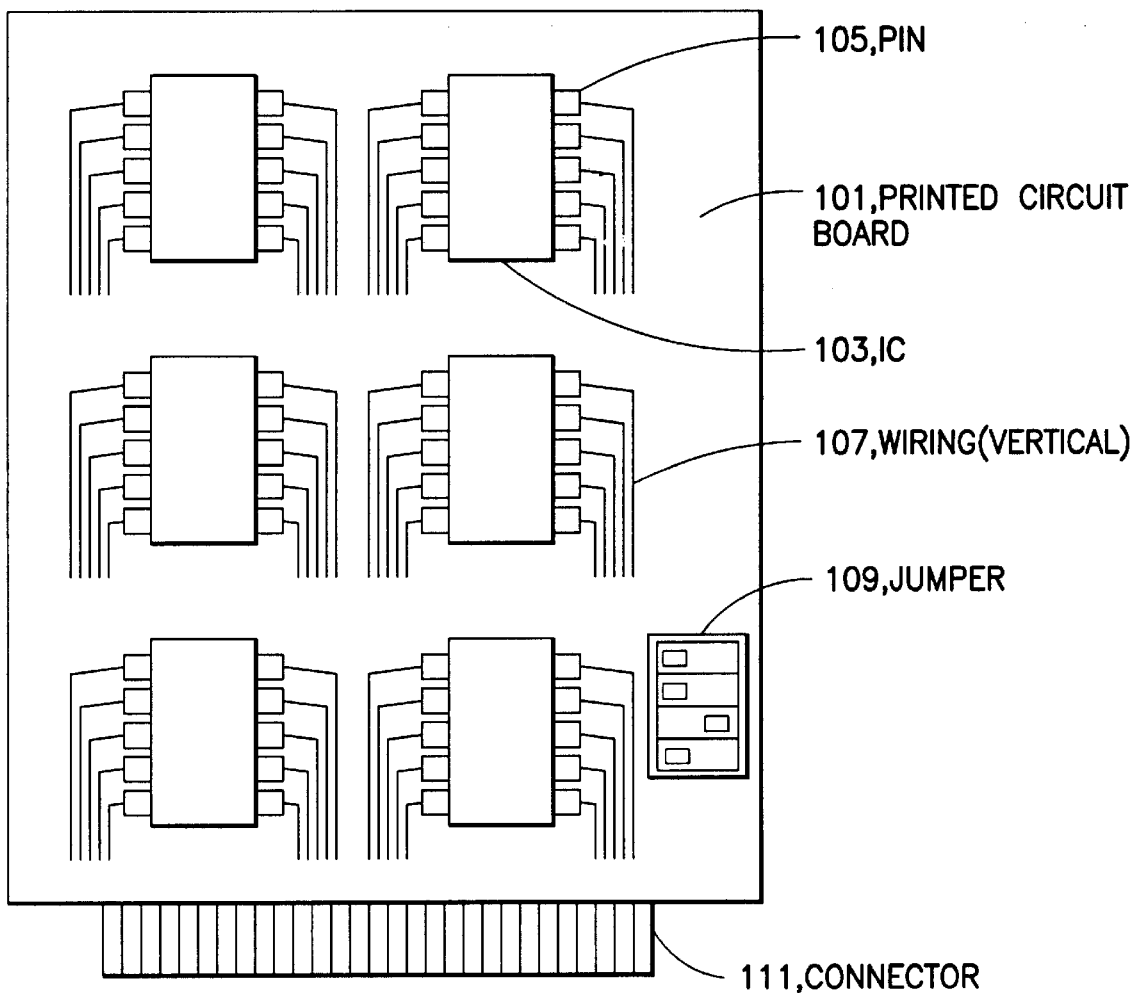
FIG. 2 describes constraints on the placement of components that are integrated circuits.

Referring to FIG. 1, an overview of an embodiment of a hardware configuration of an optimal placement system 100 used with the present invention is shown. The optimal placement system 100 includes a central processing unit (CPU) 1 and memory 4. The CPU 1 and the memory 4 are connected with a hard disk drive 13 which is auxiliary storage via a bus 2. A floppy disk drive (or a storage media drive such as MO and CD-ROM drives 26, 28, 29) 20 is connected to the bus 2 via a floppy disk controller 19 (or, a controller such as an IDE controller 25 or a SCSI controller 27).

A floppy disk (or a storage medium such as an MO or CD-ROM disk) is inserted in the floppy disk drive 20 (or a storage media drive such as an MO or CD-ROM drive). A computer program code can be stored on the floppy disk and storage media in the hard disk drives 13, 30, and the ROM 14, which cooperates with an operating system to instruct the CPU to implement the present invention, and executed by loading into the memory 4. The computer program code can be compressed, or divided into a plurality of codes to store in a plurality of media.

The optimal placement system 100 further comprises user interface hardware and may have an input device such as a pointing device (mouse or joystick) 7 and a keyboard 6 which allows the user to input data to the system, and a display 12 for presenting visual data to the user. The input device may be a touch panel. A printer and a modem may be connected to the system via a parallel port 16 and via a serial port, respectively. This information terminal assisted server 100 can be connected to a network through a modem or a communication adapter 18 (an Ethernet or token-ring card) to communicate with another computer.

A speaker 23 receives an audio signal digital-to-analog converted by an audio controller 21 through an amplifier 22 and outputs the signal as an audio output. The audio controller 21 also converts an analog audio signal received from a microphone 24 into a digital signal, allowing the audio information outside the system to be taken into the system.

Thus, it will readily be understood that the optimal placement system 100 can be implemented by an information processing terminal with communication functionality, including a conventional personal computer (PC), a general purpose computer, a workstation, a notebook PC, a palmtop PC, and a network computer, or a combination thereof. However, these components are presented herein for an illustrative purpose only and all these components are not essential to the present embodiment.

Since the purpose of the hardware configuration described above is to determine the placement of components, the audio controller 21, amplifier 22, speaker 23, and microphone 24, which are required for audio processing, the keyboard 6, mouse 7, and keyboard/mouse controller 5, which allow the user to directly input data to the system, and various types of storage media drives 19, 25, 27 can be omitted. Various modification to each components of this optimal placement system 100 may readily occur to those skilled in the art, such as, combining a plurality of machines and allocating a function to them to implement the component. Such modifications are included in the scope of the present invention.

An operating system of the optimal placement system 100 is not limited to a particular one and may be one that supports a GUI multi-window environment as standard, such as WindowsNT (a trademark of Microsoft), Windows 9x (a trademark of Microsoft), Windows 3.x (a trademark of Microsoft), OS/2 (a trademark of IBM), MVS (a trademark of IBM), MacOS (a trademark of Apple), and an X-Window system (a trade mark of MIT) on AIX (a trademark of IBM), one that supports a character-based environment, such as PC-DOS (a trademark of IBM) and MS-DOS (a trademark of Microsoft), a real time operating system, such as OS/Open (a trademark of IBM), VxWorks (a trademark of Wind River Systems, Inc.), or one that included in a network computer, such as JavaOS.

Model to Which Optimal Placement is Applied

Model to which an optimal placement of components according to the present invention is applied will be described with respect to a procedure for optimal placement of ICs as an example.

Figure 3:
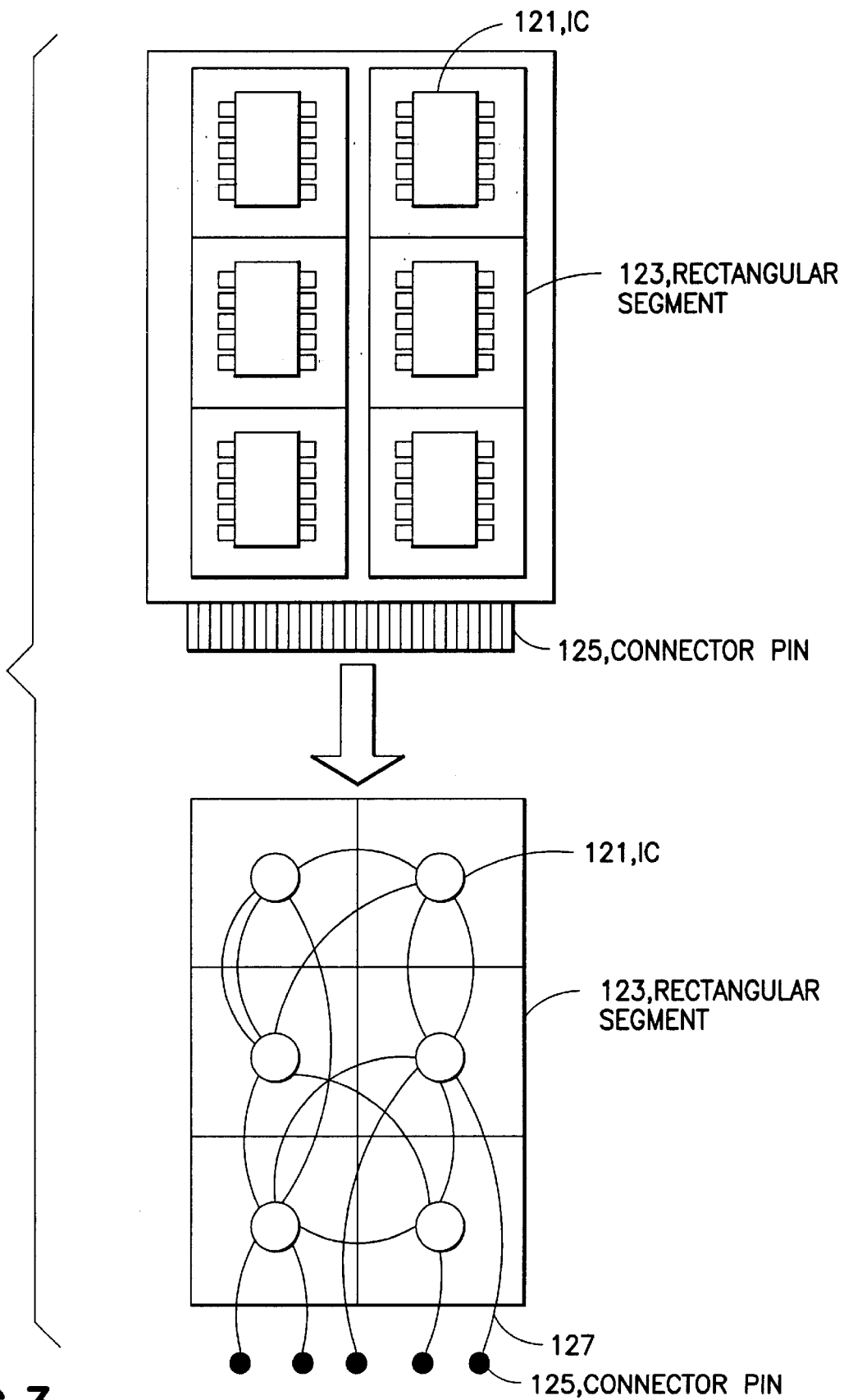
FIG. 3 describes simplification of a problem when components are integrated circuits.

1. In a model to which an optimal placement according to a preferred embodiment of the invention is applied, a placement in which related ICs are placed closer to each other based only on information about connector pins and IC connections is considered to be optimal without respect to the shape and orientation of each IC. FIG. 3 shows a conceptual diagram of a model in which components (ICs) 121 are placed without respect to their shape and orientation of them.

2. The sum of the distance between ICs that have pins to be interconnected and the distance between a connector pin 125 and an IC 121 that has a pin to be connected to the connector pin 125 is used as an evaluation function. If an IC and its target IC or connector pin have more than one pin to be connected, the distance is weighted accordingly. Information about the components to be interconnected (inter-component connection information) and about a connection between a fixed component and a component to be connected to the fixed component (fixed-component connection information) is input to the system in advance.

3. It is assumed that a substrate on which ICs are placed is divided into appropriate segments and at most one IC (component) can be placed in each segment (cell) 123.

4. The number of components is m and the number of cells is n.

5. If Comp i is in Cell j, Xij=1, otherwise, Xij=0. (i=1, 2, ..., m, j=1, 2, ..., n)

6. Because a component is placed in one of the cells, $$\sum_{j}^{n} Xij = 1 (i = 1, 2, \ldots, m). \qquad \text{[Equation 1]}$$

7. Because at most one component can be placed in one cell, $$\sum_{i}^{m} Xij \leq 1 (j = 1, 2, \ldots, n). \qquad \text{[Equation 2]}$$

8. Let the distance from a fixed component Fix k to a cell Cell j be Df(k, j), then $$Df(k, j) = |Fk(x) - Cj(x)| + |Fk(y) - Cj(y)|$$

where, Fk(x), Cj(x), Fk(y), and Cj(y) are the x and y coordinates of Fix k and Cell j.

Figure 4:
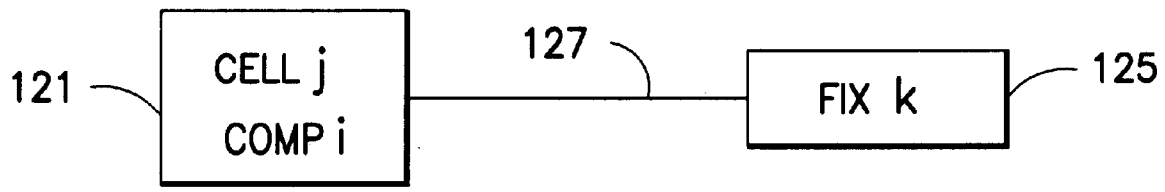
FIG. 4 shows a conceptual diagram for describing how components are connected according to a preferred embodiment of the present invention.

9. Let the number of connections to be provided between Comp i and Fix k as shown in FIG. 4 be Rf(k, i), then an evaluation value L1 when Comp i is placed in Cell j is given by $$L1 = Rf(k, i) \cdot Df(k, j).$$

10. The distance Dc(j1, J2) from Cell j1 to Cell j2 is given by $$Dc(j1, j2) = |Cj1(x) - Cj2(x)| + |Cj1(y) - Cj2(y)|.$$

Figure 5:
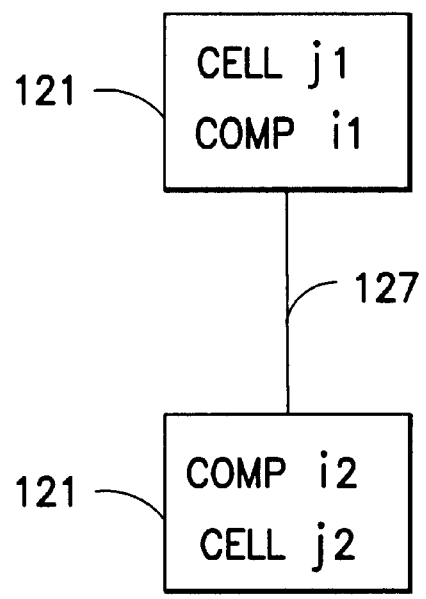
FIG. 5 shows a conceptual diagram for describing a calculation process of an optimal placement method according to a preferred embodiment of the present invention.

11. Let the number of connections to be provided between Comp i1 and Comp i2 as shown in FIG. 5 be Rc(i1, i2), then a cost evaluation value L2 when Comp i1 is placed in Cell j1 and Comp i2 is placed in Cell j2 is given by $$L2 = Rc(i1, i2) \cdot Dc(j1, j2).$$

12. Consequently, the objective function to be minimized in the preferred embodiment of the invention is as follows:

$$L = \sum_{k}^{l} \sum_{i}^{m} \sum_{j}^{n} Xij \cdot Rf(k, i) \cdot Df(k, j) + \qquad \text{[Equation 3]}$$

$$(1/2) \sum_{i1}^{m} \sum_{j1}^{n} \sum_{i2}^{m} \sum_{j2}^{n} (Xi1j1) \cdot Xi2j2 \cdot Rc(i1, i2) \cdot Dc(j1, j2)$$

The model described above can be generalized. Generally, the number of connections required between components can be considered as the strength of the relationship between components. That is, components that have a stronger relationship would be placed closer to each other.

Here, (1) the strength of the relationship between Fix k and Comp i viewed from Fix k be represented by P(k, i), (2) the strength of the relationship between Comp i and Fix k viewed from Comp i be represented by Q(i, k), (3) the strength of the relationship between Comp i1 and Comp i2 viewed from Comp i1 be represented by R(i1, i2), and, (4) the strength of the relationship between Comp i2 and Comp i1 viewed from Comp i2 be represented by R(i2, i1).

It is assumed that the strength of relationship P, Q, and R may be a negative value. If the value is negative, it would be better that the components are placed farther from each other. The strength of the relationship Rf or Rc is not necessarily symmetric in both directions if components to be placed are assumed to be those used more generally. It is assumed that distances Df(k, j) and Dc(j1, j2) are any typical values.

The evaluation value when Comp i is placed in Cell j will be,

P(k, i)·Df(k, j), viewed from Fix k, and

Q(i, k)·Df(k, j), viewed from Comp i.

The evaluation value when comp i1 is placed in Cell j1 and Comp i2 is placed in j2 will be, R(i1, i2)·Dc(j1, j2), viewed from Com i1, and R(i2, i1)·Dc(j2, j1), viewed from Comp i2.

The objective function L to be minimized is as follows:

$$L = \sum_{k}^{l} \sum_{i}^{m} \sum_{j}^{n} Xij \cdot P(k, i) \cdot Df(k, j) + \qquad \text{\{Equation 4\}}$$

$$\sum_{i}^{m} \sum_{j}^{n} \sum_{k}^{l} Xij \cdot Q(i, k) \cdot Df(k, j) +$$

-continued $$\sum_{i1}^{m}\sum_{j1}^{n}\sum_{i2}^{m}\sum_{j2}^{n} Xi1j1 \cdot Xi2j2 \cdot R(i1, i2) \cdot Dc(j1, j2) =$$

$$\sum_{i}^{m}\sum_{j}^{n}\sum_{k}^{l} Xij \cdot (P(k, i) + Q(i, k)) \cdot Df(k, j) +$$

$$\sum_{i1}^{m}\sum_{j1}^{n}\sum_{i2}^{m}\sum_{j2}^{n} Xi1j1 \cdot Xi2j2 \cdot R(i1, i2) \cdot Dc(j1, j2)$$

Optimal Placement Procedure

Overview of Optimal Placement Procedure

An overview of an optimal placement procedure according to a preferred embodiment of the invention is as follows:

1. Candidates for the location of each component are assumed.

2. Initially, all the cells are assumed to be candidates.

3. Then, the candidates are narrowed down in some way (for example, for a component that directly relates to a fixed component, the farthest cell from that fixed component is excluded from the candidates).

4. An approximation problem is created from an original placement problem and a solution that optimizes the approximation problem is obtained. The solution is a feasible solution of the original placement problem, as well.

5. The process of narrowing down the candidates and solving the approximation problem is repeated until one candidate (or more than one candidate having an equal evaluation value) is found ultimately to determine the placement the component.

Figure 6:
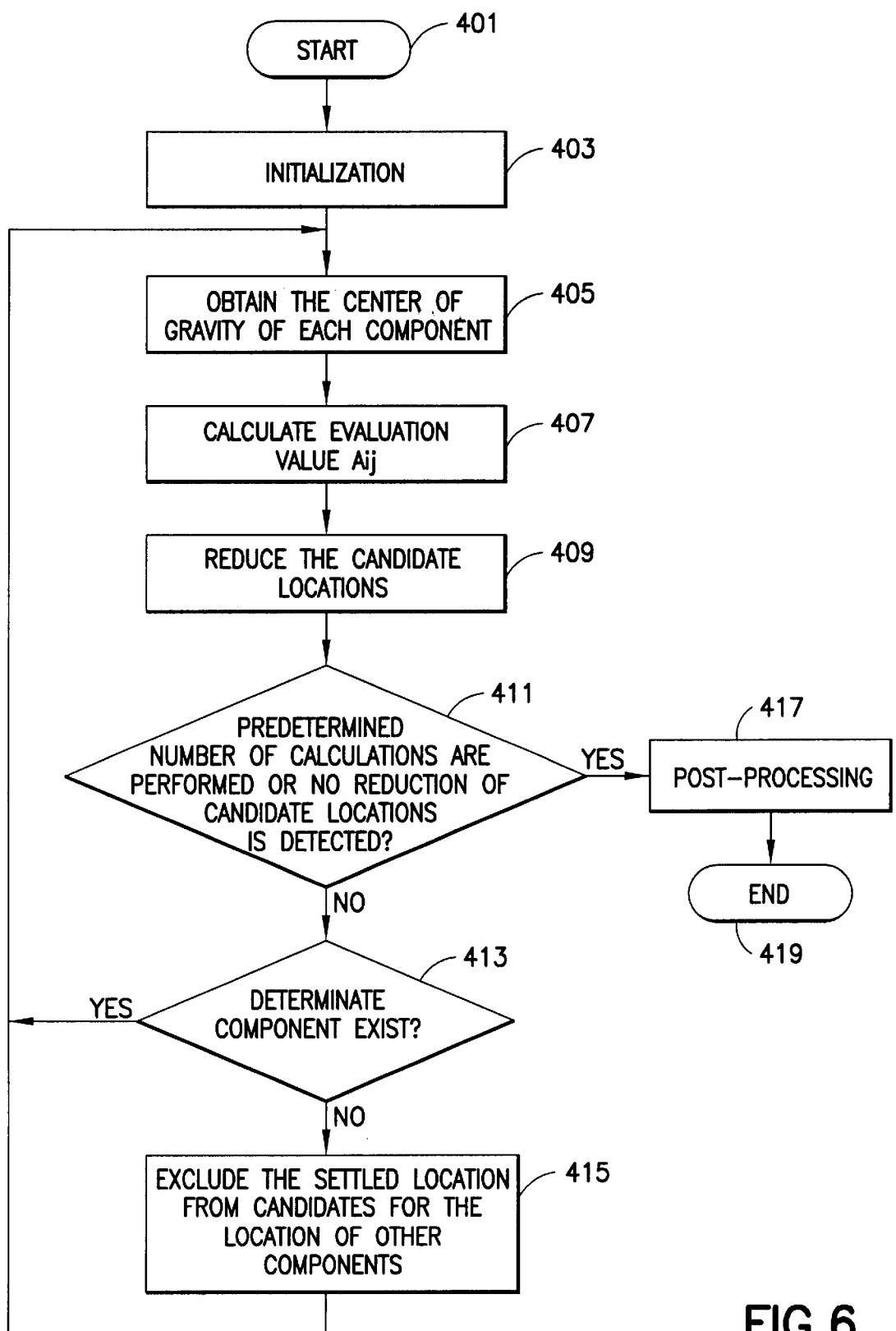
FIG. 6 shows a conceptual diagram for describing a calculation process of an optimal placement method according to a preferred embodiment of the present invention.
Figure 7:
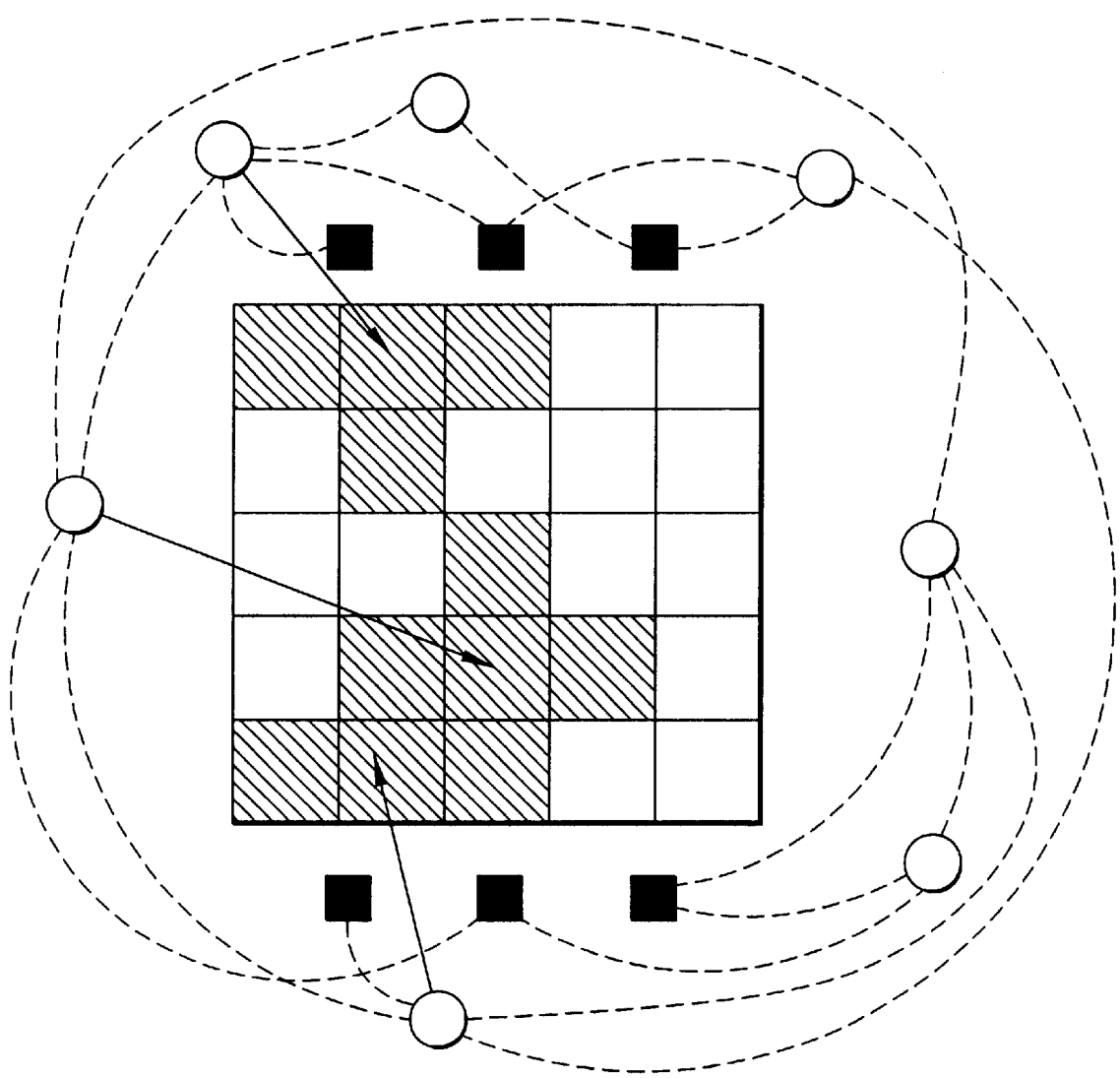
FIG. 7 shows a conceptual diagram for describing a calculation process of an optimal placement method according to a preferred embodiment of the present invention.

FIG. 6 shows a flowchart describing an optimal placement procedure according to a preferred embodiment of the invention. In this example, as shown in FIG. 6, information about the relationship between components, between a components and a fixed component, and the status of cells is input to the optimal placement system during the initialization of the system at the step 403. In addition, candidates for the location of each component are initialized.

Next, the center of gravity of each component is calculated (step 405), then, based on the calculated value, the evaluation value Aij is calculated.

Based on the calculated evaluation value Aij, a reduction of candidates for the location of each component is tried. When a predetermined number of calculations are performed or no reduction of the candidate location is found (step 411), it is determined that an optimal placement is obtained. Then, after post-processing such as an output operation of the optimal value is performed (step 417), the process is completed (step 419).

If a reduction of candidates is found before a predetermined number of calculations are performed, whether a settled component (a component that has only one candidate location) exists or not is determined (step 413). If no determinate component exist, the process returns to step 405. If a settled component exist, the location of the settled component is excluded from candidates for the location of other components and the process returns to step 405 (step 415).

Candidate Locations

Figure 8:
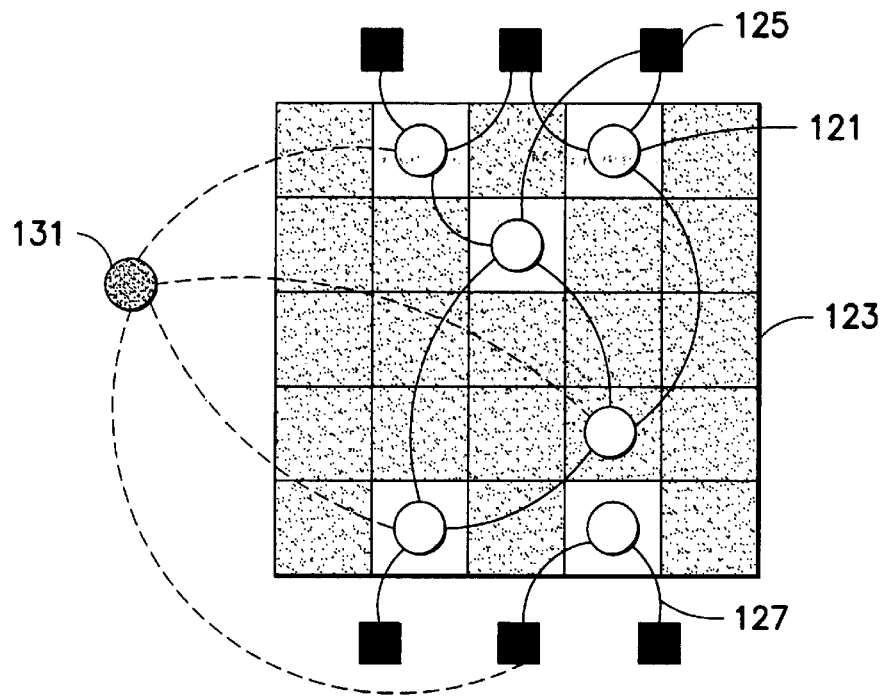
FIG. 8 shows a conceptual diagram for describing a calculation process of an optimal placement method according to a preferred embodiment of the present invention.

Suppose that an optimal placement is achieved and one component (the current component, for example, component A) 131 is excluded from the optimal placement (FIG. 8). And consider how the optimal placement can be regained.

Because all the components except component A have been placed in their appropriate cells, cells except those cells are candidates for the location to which component A can be placed (shaded cells in FIG. 8).

If component A is in a cell "Cell j" that is one of its candidates cells, the evaluation value of component A is as follows:

$$LAj = \sum_{k}^{1} Rf(k, A) \cdot Df(k, j) + \sum_{i2} Rc(A, i2) \cdot Dc(j, j2) \qquad \text{[Equation 5]}$$

Figure 9:
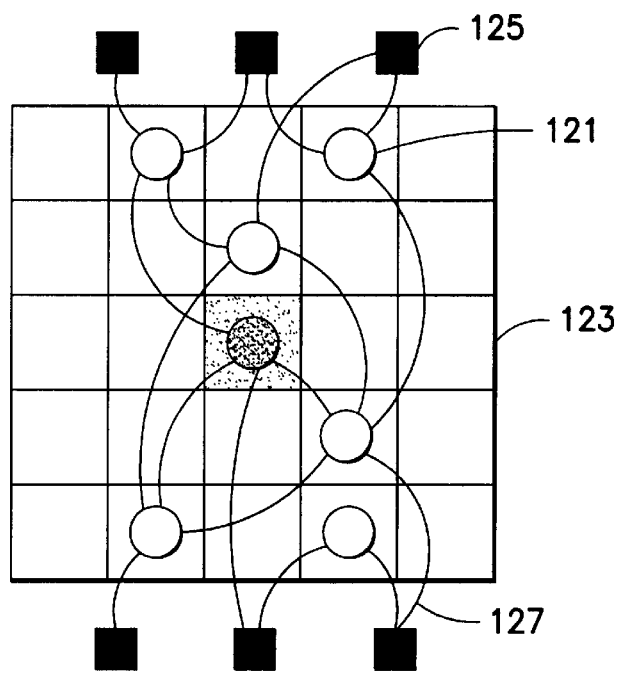
FIG. 9 shows a conceptual diagram for describing a calculation process of an optimal placement method according to a preferred embodiment of the present invention.

Here, cells (Cell j2) in which components (Comp i2) other than component A is placed are known. Assume that a cell that provides the minimum evaluation value in the candidate cells is Cell j0:

$$LAj0 = \underset{j}{\text{Min}} \{LAj\}$$

then, all cells that provide this minimum value is optimal placement locations for component A (FIG. 9), and one of them should include the original optimal solution.

For the problem of the placement of component A, if Comp i is in Cell j, XAj=1, otherwise, XAj=0. The problem also has a constraint: j ∈E[A].

Here, E[A] is the numbers of all the cells on which component A can be placed, that is, a set of cells excluding the cells on which components other than component A are placed.

Thus, the following conditional expression is provided:

$$\sum_{j \in E[A]}^{1} XAj = 1 \qquad \text{[Equation 6]}$$

The objective function LA to be minimized is $$LA = \sum_{k}^{1}\sum_{j \in E[A]} XAj \cdot Rf(k, A) \cdot Df(k, j) + \qquad \text{[Equation 7]}$$

$$\sum_{i2}^{m}\sum_{j \in E[A]} XAj \cdot Rc(A, i2) \cdot Dc(j, J(i2))$$

where, J(i2) is the number of a cell on which Comp i2 is placed. If the position of the cell is considered as the center of gravity G(i2) of the cells on which Comp i2 can be placed and Dc(j, J(i2)) is rewritten as D(j, G(i2)), then the following equation is provided:

$$LA = \sum_{k}^{l}\sum_{j \in E[A]} XAj \cdot Rf(k, A) \cdot Df(k, j) + \qquad \text{[Equation 8]}$$

$$\sum_{i2}^{m}\sum_{j \in E[A]} XAj \cdot Rc(A, i2) \cdot Dc(j, G(i2))$$

Figure 10:
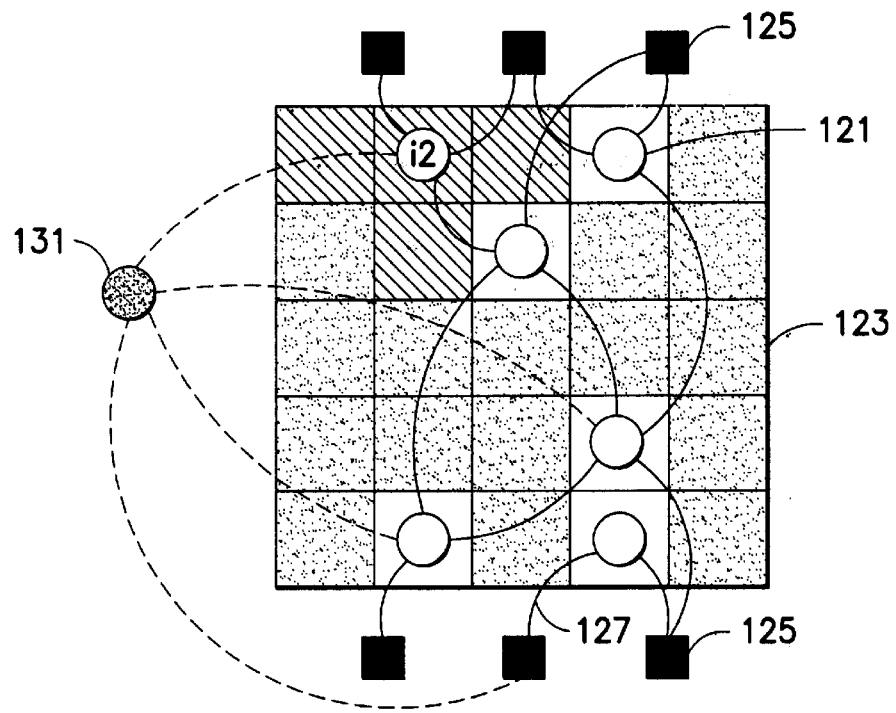
FIG. 10 shows a conceptual diagram for describing a calculation process of an optimal placement method according to a preferred embodiment of the present invention.
Figure 11:
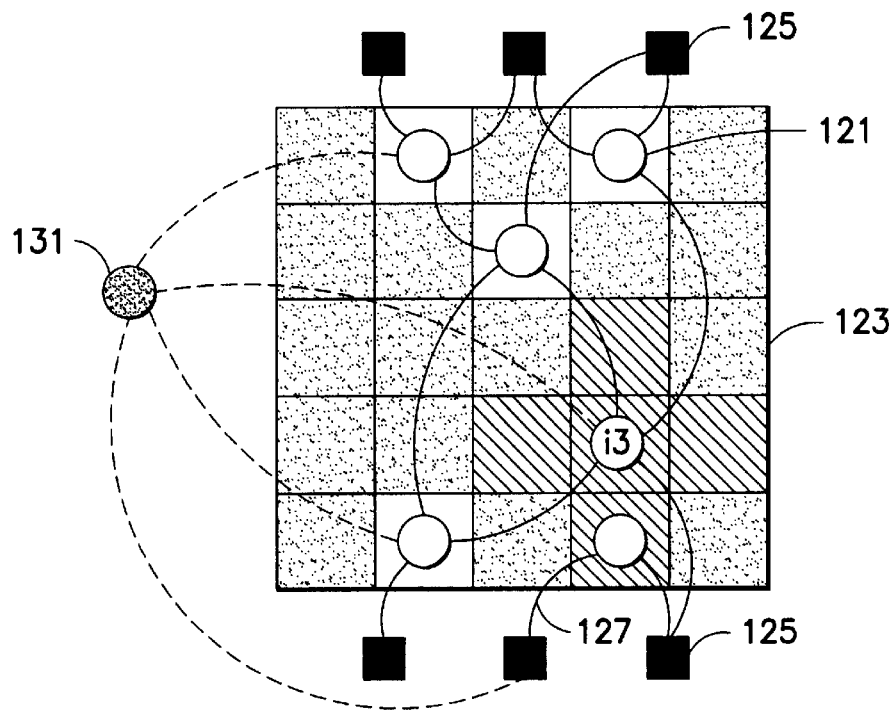
FIG. 11 shows a conceptual diagram for describing a calculation process of an optimal placement method according to a preferred embodiment of the present invention.

Assuming that, as shown in FIG. 10, components other than component A also have a plurality of cells as their candidate location, which are in the vicinity of a cell on which each of the components has been ultimately placed. For example, FIG. 10 shows Comp i2 having four cells as its candidate location and FIG. 11 shows Comp i3 having five cells as its candidate location.

Under this conditions, let the center of gravity of each of the components Comp i2 other than component A be G(i2), then the evaluation value L'A will be as follows:

$$L'_A = \sum_k^l \sum_j^n X_{Aj} \cdot Rf(k, A) \cdot Df(k, j) + \sum_{i2}^m \sum_j^n X_{Aj} \cdot Rc(A, i2) \cdot D(j, G(i2))$$ [Equation 9]

This equation represents that each of components Comp i2 other than component A is at the center of gravity of its candidate location. If the center of gravity of the candidate location of each component Comp i2 is close enough to the position of its optimal placement cell, it is expected that the placement of A that minimizes the value of L'A is also close to an optimal solution.

While the component A was considered as a point of reference herertofore, any other components can be considered similarly.

The evaluation function of the placement of Comp i is as follows:

$$L'_i = \sum_k^l \sum_j^n X_{ij} \cdot Rf(k, i) \cdot Df(k, j) + \sum_{i2}^m \sum_j^n X_{ij} \cdot Rc(i, i2) \cdot D(j, G(i2))$$ [Equation 10]

Thus, the evaluation function of the entire placement $$L' = \sum_i^m \sum_k^l \sum_j^n X_{ij} \cdot Rf(k, i) \cdot Df(k, j) + \sum_i^m \sum_{i2}^m \sum_j^n X_{ij} \cdot Rc(i, i2) \cdot D(j, G(i2))$$ [Equation 11]

can be considered as an approximate value of the objective function L.

Because the relationship between the number m of components and the number n of cells is n≧m, (n−m) dummy components are introduced to rewritten in a format of assignment problem as follows:

Each component is placed in one of cells, therefore $$\sum_j^n X_{ij} = 1 (i = 1, 2, \ldots, n)$$ [Equation 12]

Every cell contains one cell, therefore $$\sum_i^n X_{ij} = 1 (i = 1, 2, \ldots, n)$$ [Equation 13]

The objective function L' to be minimized is $$L' = \sum_i^m \sum_k^l \sum_j^n X_{ij} \cdot Rf(k, i) \cdot Df(k, j) + \sum_i^m \sum_{i2}^m \sum_j^n X_{ij} \cdot Rc(i, i2) \cdot D(j, G(i2))$$ [Equation 14]

Let Rf and Rc for the dummy components be all 0, then $$L' = \sum_i^m \sum_k^l \sum_j^n X_{ij} \cdot Rf(k, i) \cdot Df(k, j) + \sum_i^n \sum_{i2}^n \sum_j^n X_{ij} \cdot Rc(i, i2) \cdot D(j, G(i2)) = \sum_i^n \sum_j^n \left( \sum_k^l Rf(k, i) \cdot Df(k, j) + \sum_{i2}^n Rc(i, i2) \cdot D(j, G(i2)) \right) \cdot X_{ij}$$ [Equation 15]

This equation represents an assignment problem. It is apparent that the solution of the assignment problem is a feasible solution of the original problem because it satisfies the constraint equation of the original replacement problem.

Candidate Reduction Algorithm

It is expected that a feasible solution approaches an optimal solution by reducing candidate cells for each component to one cell assuring that a feasible solution is kept, thus a good solution can be obtained. A criterion to be used to reduce candidate cells is important. When Comp i is placed in Cell j, the evaluation value is as follows:

$$A_{ij} = \sum_k^l Rf(k, i) \cdot Df(k, j) + \sum_{i2}^n Rc(i, i2) \cdot D(j, G(i2))$$ {Equation 16}

A cell that provides a large value of Aij is considered to be undesirable as a candidate location.

In a preferred embodiment of the present invention, a criterion used to exclude an undesirable cell is called a "exclusion criterion." The criterion is very important because the speed at which a solution is reached and the precision of the solution (the difference between the solution and an optimal solution) depends on the exclusion criterion. The most natural exclusion criterion is to exclude the maximum Aij value, therefore this criterion is used first.

Let a set of candidate cells for Comp i at a time point be C[i], and $$aijmax = Max\{A_{ij} | j \in C[i]\}$$

is considered as a cell inappropriate for the placement of the component and excluded from the set C[i].

1. Initially, all the cells are assumed to be candidates for the location of each of all the components.

2. The center of gravity G (i) of the position of the candidate cells for each component Comp i (i=1, 2, . . . , m) is obtained.

3. The Aij value is calculated as follows:

$$A_{ij} = \sum_k^l Rf(k, i) \cdot Df(k, j) + \sum_{i2}^m Rc(i, i2) \cdot D(j, G(i2))$$ [Equation 17]

$$(i = 1, 2, \ldots, m, j = 1, 2, \ldots, n)$$

Set $A_{ij} = 0$ for $i = m+1, \ldots, n$.

4. Aij is put as a matrix element and the assignment problem is solved. Among the solutions, let a set of the combination of Comp i (i=1, 2, . . . , m) and the number of cells to which the Comp i is assigned be a feasible solution S.

S={j1, j2, ..., jm}
5. For every i, Ai jmax is calculated as follows:

$$A\ i\ jmax = Max\ \{Aij | j \in C[i]\}$$

and let the C[i] excluding jmax be new C[i]. ji which is in the feasible solution S is not excluded. If no further candidate can be excluded, the feasible solution at that point is the best solution. If the best solution is not obtained, the procedure returns to step 2.

Example

A procedure for determining optimal placement according to a preferred embodiment of the invention will be described with reference to FIG. 12. In this example, there are three fixed components (Fix 1–3), and each of four components (Comp 1–4) is placed in one of nine cells (Cell 1–9).

Figures 12, 13, 14:
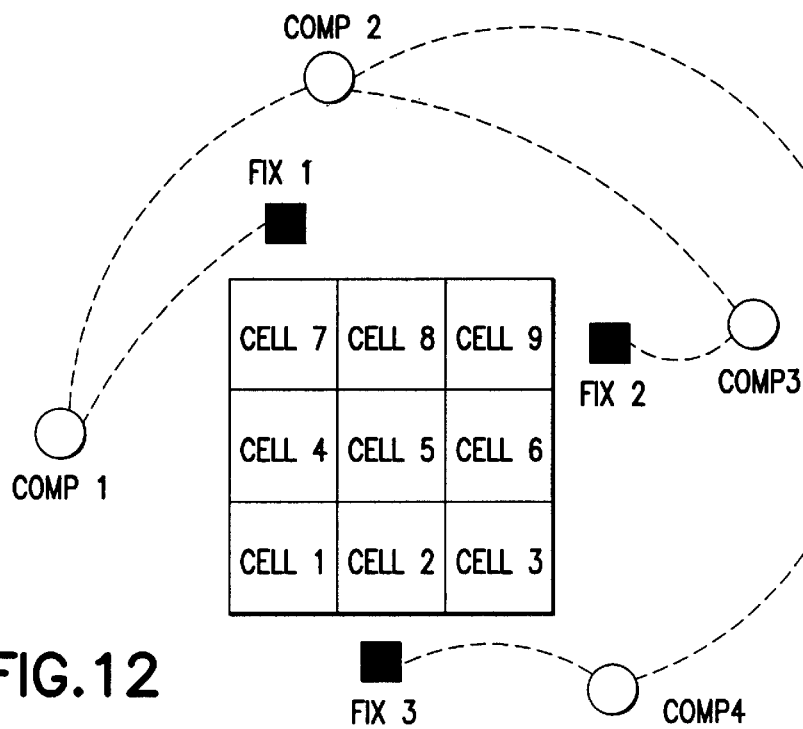
FIG. 12 shows a conceptual diagram for describing a model to which an optimal placement method according to a preferred embodiment of the present invention is applied.
FIG. 13 shows a conceptual diagram for describing a model to which an optimal placement method according to a preferred embodiment of the present invention is applied.
FIG. 14 shows a conceptual diagram for describing a model to which an optimal placement method according to a preferred embodiment of the present invention is applied.

The relationship between fixed components and non-fixed components and the relationship between non-fixed components are shown in FIGS. 13 and 14, respectively. In this example, Comp 1 and Fix 1, Comp 3 and Fix 2, and Comp 4 and Fix 3 should be connected each other and comp 1 and Comp 2, Comp 2 and Comp 3, and Comp 2 and Comp 4 should be connected each other as shown in the figures.

Assume the coordinates of the fixed components and the cells are

Fix 1: (3, 9)
Fix 2: (9, 7)
Fix 3: (5, 1)
Cell 1: (3, 3)
Cell 2: (5, 3)
Cell 3: (7, 3)
Cell 4: (3, 5)
Cell 5: (5, 5)
Cell 6: (7, 5)
Cell 7: (3, 7)
Cell 8: (5, 7)
Cell 9: (7, 7).

First, because no candidate is excluded yet, the initial values of the candidate cells for the four components are as follows:

C1[1]={1, 2, 3, 4, 5, 6, 7, 8, 9}
C2[1]={1, 2, 3, 4, 5, 6, 7, 8, 9}
C3[1]={1, 2, 3, 4, 5, 6, 7, 8, 9}
C4[1]={1, 2, 3, 4, 5, 6, 7, 8, 9}.

At this point, the center of gravity of each candidate is as follows:

G1(1)=(5, 5)
G1(2)=(5, 5)
G1(3)=(5, 5)
G1(4)=(5, 5).

Evaluation values Aij at this point are calculated as follows:

TABLE 1

| 8.8 | 8.3 | 10.0 | 6.0 | 4.5 | 7.7 | 4.8 | 4.8 | 7.3 |
| 8.5 | 6.0 | 8.5 | 6.0 | 0 | 6.0 | 8.5 | 6.0 | 8.5 |
| 10.0 | 7.7 | 7.3 | 8.3 | 4.5 | 4.8 | 8.8 | 6.0 | 4.8 |
| 5.7 | 4.0 | 5.7 | 6.5 | 4.0 | 6.5 | 9.2 | 8.0 | 9.2 |

This matrix represents evaluation values when Comp 1 is placed in Cell j and the other components are placed at their position of the center of gravity.

For example, $A_{12}$ is the evaluation value when Comp 1 is placed in cell 2 and the other components are placed at position (5, 5), therefore $$Aij = \text{(the number of lines between Comp 1 and Fix 1} \times \text{the distance between Comp 1 and Fix 1)} +$$
$$\text{(the number of lines between Comp 1 and Comp 2} \times \text{the distance between Comp 1 and Comp 2)}$$
$$= \left(1 \times ((3-5)^2 + (9-3)^2)^{1/2}\right) +$$
$$\left(1 \times ((5-5)^2 + (3-5)^2)^{1/2}\right)$$
$$= 8.3246$$

Next, the assignment problem is solved.

Subtracting the same value from each row of Aij does not change the best solution. Therefore, the minimum value (4.5, 0, 4.5, 4) is taken from each row:

TABLE 2

| 4.3 | 3.8 | 5.5 | 1.5 | 0 | 3.2 | 0.3 | 0.3 | 2.8 |
| 8.5 | 6.0 | 8.5 | 6.0 | 0 | 6.0 | 8.5 | 6.0 | 8.5 |
| 5.5 | 3.2 | 2.8 | 3.8 | 0 | 0.3 | 4.3 | 1.5 | 0.3 |
| 1.7 | 0 | 1.7 | 2.5 | 0 | 2.5 | 5.2 | 4.0 | 5.2 |

Taking the same value from each column of Aij does not affect the best solution. Therefore, the minimum value (1.7, 0, 1.7, 1.5, 0, 0.3, 0.3, 0.3) is taken from each column:

TABLE 3

| 2.6 | 3.8 | 3.8 | 0 | 0 | 2.9 | 0 | 0 | 2.5 |
| 6.8 | 6 | 6.8 | 4.5 | 0 | 5.7 | 8.2 | 5.7 | 8.2 |
| 3.8 | 3.2 | 1.1 | 2.3 | 0 | 0 | 4 | 1.2 | 0 |
| 0 | 0 | 0 | 1 | 0 | 2.2 | 4.9 | 3.7 | 4.9 |

If four 0s can be taken so that two or more 0s from the same row and the same column are not taken, the best solution is yield. If 0 in the column 4 is taken from row 1, 0 in the column 5 from row 2, 0 in column 6 or 9 from row 3, and 0 in column 1, 2, or 3 from row 4 can be taken. If 0 in column 7 from row 1 is taken, 0 in column 5 from row 2, 0 in column 6 or 9 from row 3, and 0 in column 1 or 2 from row 4 can be taken. S1={7, 5, 9, 2}, which is one of the best solutions, is assumed to be the solution here.

5-1. Candidates are reduced.

Figure 15:
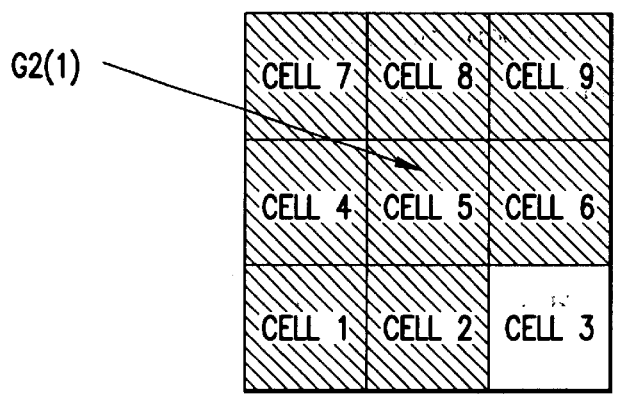
FIG. 15 shows a conceptual diagram for describing a calculation process of an optimal placement method according to a preferred embodiment of the present invention.

The maximum value in row 1 of Aij is 10.0 in column 3, therefore Cell 3 is excluded from the candidates to provide C2[1]={1, 2, 4, 5, 6, 7, 8, 9} (FIG. 15).

Figure 16:
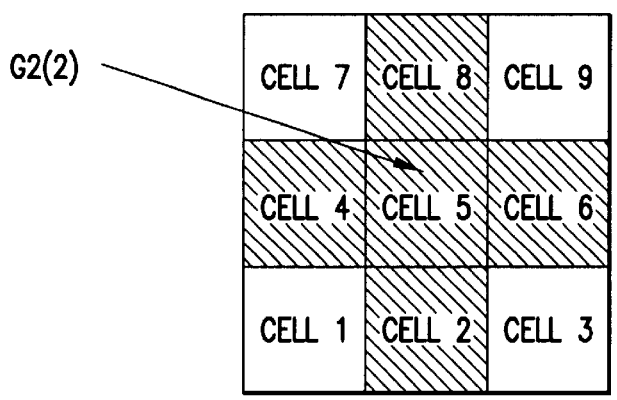
FIG. 16 shows a conceptual diagram for describing a calculation process of an optimal placement method according to a preferred embodiment of the present invention.

The maximum value in row 2 of Aij is 8.5 in columns 1, 3, 7 and 9, therefore Cell 1, 3, 7, and 9 are excluded from the candidates to provide C2[2]={2, 4, 5, 6, 8} (FIG. 16).

Figure 17:
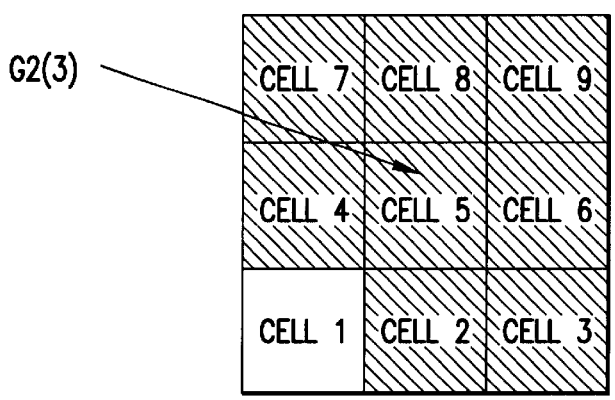
FIG. 17 shows a conceptual diagram for describing a calculation process of an optimal placement method according to a preferred embodiment of the present invention.

The maximum value in row 3 of Aij is 10.9 in column 1, therefore Cell 1 is excluded from the candidate to provide C2[3]={2, 3, 4, 5, 6, 7, 8, 9} (FIG. 17).

Figure 18:
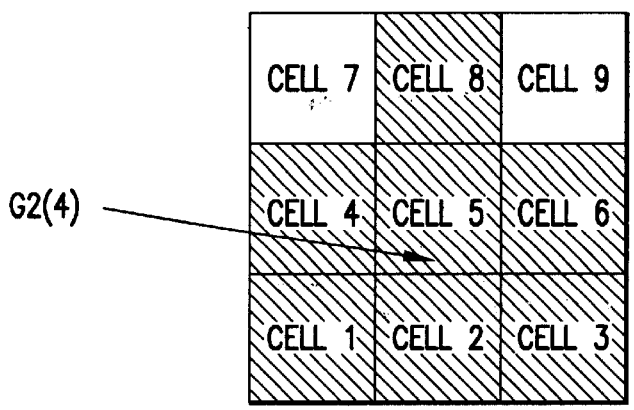
FIG. 18 shows a conceptual diagram for describing a calculation process of an optimal placement method according to a preferred embodiment of the present invention.

The maximum value in row 4 of Aij is 9.2 in columns 7 and 9, therefore Cell 7 and 9 are excluded from the candidates to provide C2[4]={1, 2, 3, 4, 5, 6, 8} (FIG. 18).

2-2. The center of gravity of each candidates is calculated:

G2(1)=(4.8, 5.3)
G2(2)=(5, 5)
G2(3)=(5.3, 5.3)
G2(4)=(5, 4.4).

3-2. The evaluation values Aij are as follows:

TABLE 4

| | | | | | | | | |
|---|---|---|---|---|---|---|---|---|
| 8.8 | 8.3 | 10.0 | 6.0 | 4.5 | 7.7 | 4.8 | 4.8 | 7.3 |
| 8.5 | 6.0 | 8.5 | 6.1 | 1.3 | 6.1 | 8.6 | 6.0 | 8.6 |
| 10.0 | 7.7 | 7.3 | 8.3 | 4.5 | 4.8 | 8.8 | 6.0 | 4.8 |
| 5.7 | 4.0 | 5.7 | 6.8 | 4.0 | 6.5 | 9.2 | 8.0 | 9.2 |

4-2. Solve the placement problem as described at the step 4-1, then S2={7, 5, 9, 2}.

5-2. The candidates are reduced.

Figure 19:
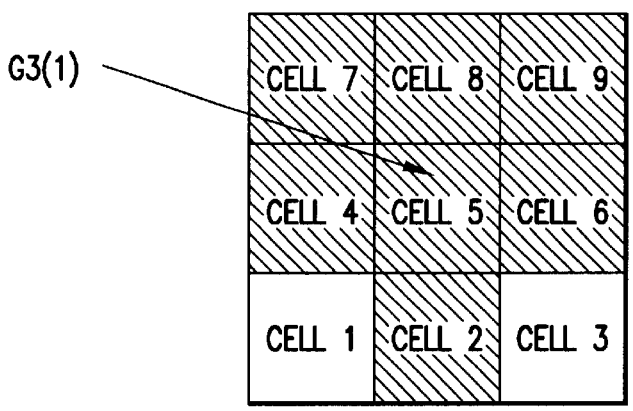
FIG. 19 shows a conceptual diagram for describing a calculation process of an optimal placement method according to a preferred embodiment of the present invention.

Because the maximum value in row 1 of Aij is 8.8 in column 1 out of the columns corresponding to the candidates 1, 2,, 4, 5, 6, 7, 8 and 9, Cell 1 is excluded from the candidates (FIG. 19):

C3[1]={2, 4, 5, 6, 7, 8, 9}.

Figure 20:
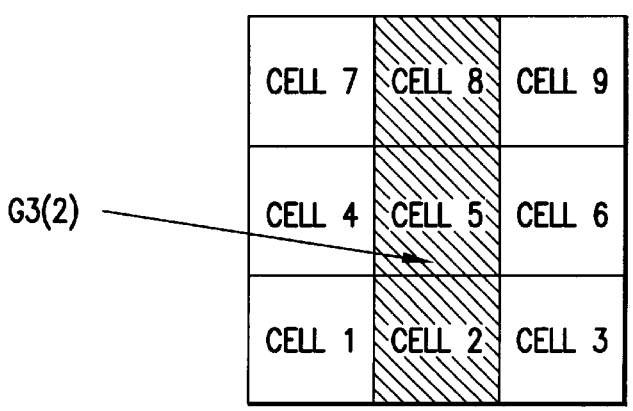
FIG. 20 shows a conceptual diagram for describing a calculation process of an optimal placement method according to a preferred embodiment of the present invention.
Figure 27:
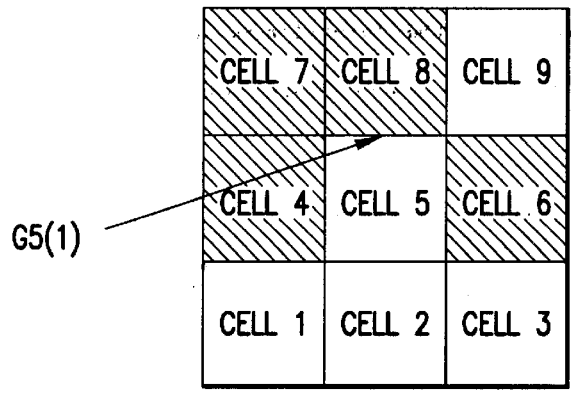
FIG. 27 shows a conceptual diagram for describing a calculation process of an optimal placement method according to a preferred embodiment of the present invention.
Figure 28:
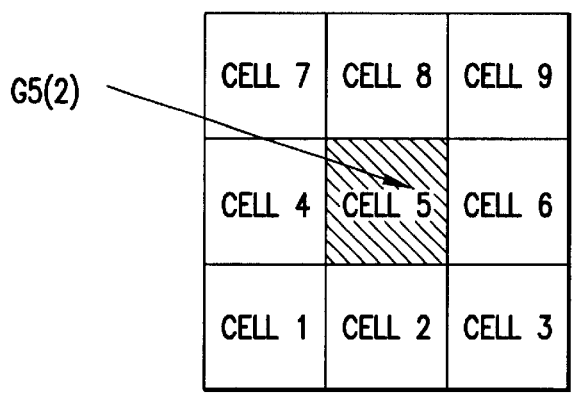
FIG. 28 shows a conceptual diagram for describing a calculation process of an optimal placement method according to a preferred embodiment of the present invention.
Figure 29:
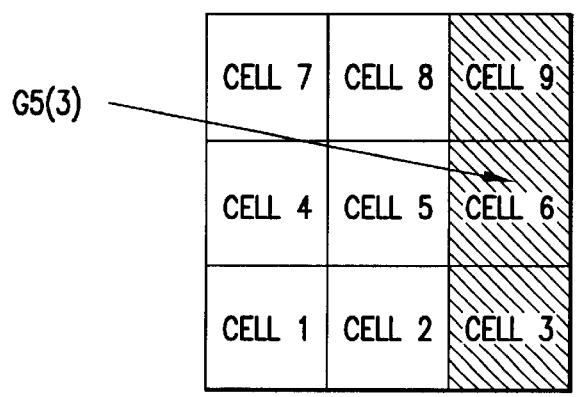
FIG. 29 shows a conceptual diagram for describing a calculation process of an optimal placement method according to a preferred embodiment of the present invention.
Figure 39:
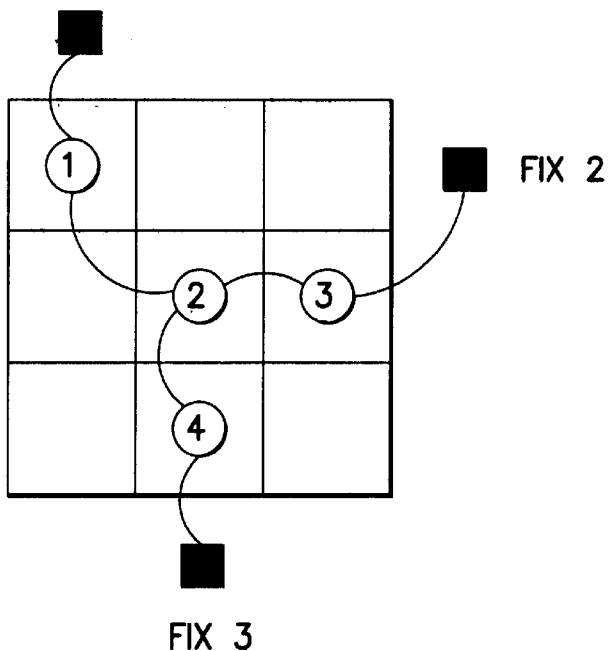
FIG. 39 shows a conceptual diagram for describing a calculation result of an optimal placement method according to a preferred embodiment of the present invention.
Figure 40:
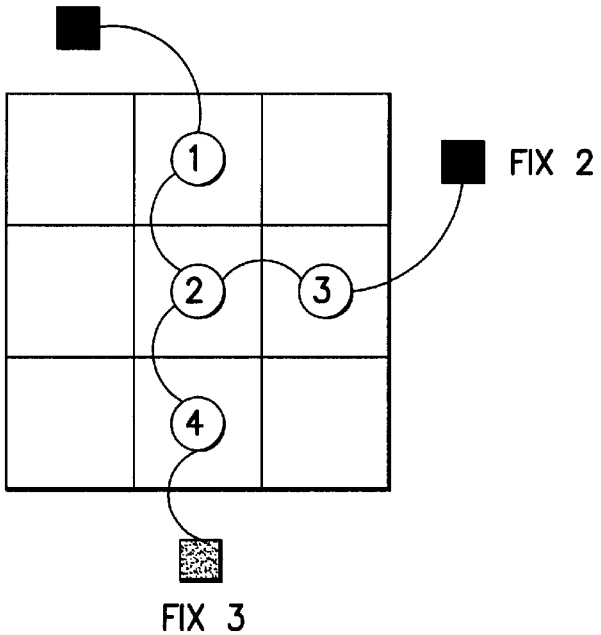
FIG. 40 shows a conceptual diagram for describing a calculation result of an optimal placement method according to a preferred embodiment of the present invention.
Figure 41:
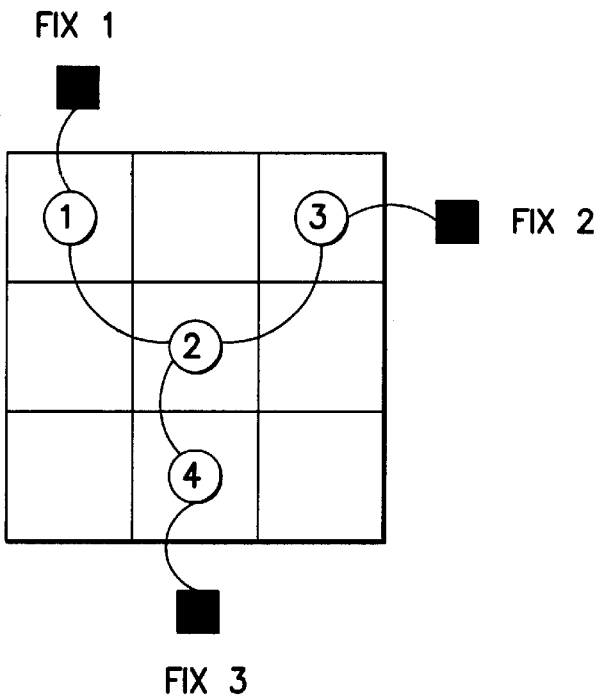
FIG. 41 shows a conceptual diagram for describing a calculation result of an optimal placement method according to a preferred embodiment of the present invention.
Figure 42:
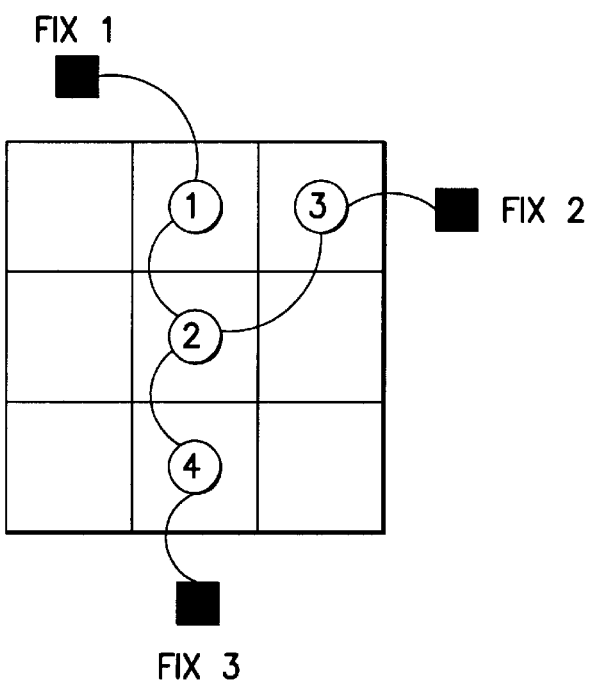
FIG. 42 shows a conceptual diagram for describing a calculation result of an optimal placement method according to a preferred embodiment of the present invention.

Similarly, for rows 2, 3, and 4, the maximum value in a column out of columns corresponding candidates is excluded (FIGS. 20 through 22) as follows:

C3[2]={2, 5, 8}

C3[3]={2, 3, 4, 5, 6, 8, 9}

C3[4]={1, 2, 3, 4, 5, 6}.

2-3. The center of gravity of the candidates are:

G3(1)=(5, 5.6)

G3(2)=(5, 5)

G3(3)=(5.6, 5)

G3(4)=(5, 4).

3-3. The evaluation values Aij are:

TABLE 5

| | | | | | | | | |
|---|---|---|---|---|---|---|---|---|
| 8.8 | 8.3 | 10.0 | 6.0 | 4.5 | 7.7 | 4.8 | 4.8 | 7.3 |
| 8.8 | 5.7 | 8.0 | 6.9 | 2.1 | 5.7 | 9.3 | 6.5 | 8.5 |
| 10.0 | 7.7 | 7.3 | 8.3 | 4.5 | 4.8 | 8.8 | 6.0 | 4.8 |
| 5.7 | 4.0 | 5.7 | 6.5 | 4.0 | 6.5 | 9.2 | 8.0 | 9.2 |

4-3. The placement problem is solved as described at the step 4-1, then S3={7, 5, 9, 2}.

5-3. The candidates are reduced (FIGS. 23 through 26).

Because the maximum value in row 1 of Aij is 8.3 in column 2 out of the columns corresponding to the candidates 2, 4, 5, 6, 7, 8, and 9, Cell 2 is excluded from the candidates as follows:

C3[1]={4, 5, 6, 7, 8, 9}.

Similarly, for rows 2, 3, and 4, the maximum value in a column out of column S corresponding to candidates is excluded as follows:

C3[2]={2, 5}

C3[3]={2, 3, 5, 6, 8, 9}

C3[5]={1, 2, 3, 5}.

2-4. Thus, the center of gravity of each candidates is:

G4(1)=(5, 6)

G4(2)=(5, 4)

G4(3)=(6, 5)

G4(4)=(5, 3, 5).

3-4. Now, the evaluation values Aij are:

TABLE 6

| | | | | | | | | |
|---|---|---|---|---|---|---|---|---|
| 8.2 | 7.3 | 9.4 | 6.2 | 5.5 | 7.9 | 5.6 | 5.8 | 8.1 |
| 9.3 | 5.7 | 7.9 | 7.7 | 3.5 | 5.7 | 9.9 | 6.7 | 8.5 |
| 9.4 | 6.7 | 6.7 | 8.6 | 5.5 | 5.1 | 9.6 | 7.0 | 5.6 |
| 5.1 | 3.0 | 5.1 | 6.7 | 5.0 | 6.7 | 9.9 | 9.0 | 9.9 |

4-4. Solve the placement problem as described at the step 4-1, then S4={7, 5, 9, 2}.

5-4. The candidates are reduced.

Because the maximum value in row 1 of Aij is 8.1 in column 9 out of the columns corresponding to the candidates 4, 5, 6, 7, 8, and 9, Cell 9 is excluded from the candidates, yielding C4[1]=(4, 5, 6, 7, 8). Similarly, for rows 2, 3, and 4, the candidates are reduced based on the maximum value out of columns corresponding to the candidates, yielding C4[2]={5}, C4[3]={2, 3, 5, 6, 9}, and C4[4]={2, 5}.

As indicated by C4[2]={5}, only Cell 5 is the candidate for the location of Comp 2. Therefore, the cell is determined as the candidate cell for Comp 2 and excluded from the candidates for the location of the other components. Similarly, because only Cell 2 is the determinate candidates for the location of Comp 4, Cell 2 is excluded from the candidates for the location of the other cells. As a result, C4[1]={4, 6, 7, 8}, C4[2]={5}, C4[3]={3, 6, 9}, and C4[4]={2} (FIGS. 27 through 30).

2-5. Thus, the center of gravity of each candidate is:

G5(1)=(4.5, 6)

G5(2)=(5, 5)

G5(3)=(7, 5)

G5(4)=(5, 3).

3-5. Now, the evaluation values Aij are:

TABLE 7

| | | | | | | | | |
|---|---|---|---|---|---|---|---|---|
| 8.8 | 8.3 | 10.0 | 6.0 | 4.5 | 7.7 | 4.8 | 4.8 | 7.3 |
| 9.8 | 5.9 | 7.9 | 8.6 | 5.1 | 5.5 | 10.7 | 7.9 | 9.2 |
| 10.0 | 7.7 | 7.3 | 8.3 | 4.5 | 4.8 | 8.8 | 6.0 | 4.8 |
| 5.7 | 4.0 | 5.7 | 6.5 | 4.0 | 6.5 | 9.2 | 8.0 | 9.2 |

4-5. Solve the placement problem as described at the step 4-1, then S5={7, 5, 9, 2}.

5-5. The candidates are reduced.

Because the maximum value in row 1 of Aij is 7.7 in column 6 out of the columns corresponding to the candidates 4, 6, 7, and 8, Cell 6 is excluded from the candidates, yielding C4[1]={4, 7, 8}. Similarly, for row 3, the candidates are excluded based on the maximum value out of columns corresponding to the candidates, yielding C4[3]={6, 9}. C4[2]={5} and C4[4]={2, 5} have already been determined (FIGS. 31 through 34).

2-6. The center of gravity of each candidate is:

G6(1)=(3.7, 6.3)

G6(2)=(5, 5)

G6(3)=(7, 6)

G6(4)=(5, 3).

3-6. Evaluation values Aij are

TABLE 8

| | | | | | | | | |
|---|---|---|---|---|---|---|---|---|
| 8.8 | 8.3 | 10.0 | 6.0 | 4.5 | 7.7 | 4.8 | 4.8 | 7.3 |
| 10.4 | 7.2 | 9.7 | 8.4 | 6.1 | 7.4 | 9.5 | 7.7 | 8.9 |
| 10.0 | 7.7 | 7.3 | 8.3 | 4.5 | 4.8 | 8.8 | 6.0 | 4.8 |
| 5.7 | 4.0 | 5.7 | 6.5 | 4.0 | 6.5 | 9.2 | 8.0 | 9.2 |

4-6. Solve the placement problem as described at the step 4-1, then S6={7, 5, 9, 2}.

5-6. The candidates are reduced.

Because the maximum value in row 1 of Aij is 6.0 in column 4 out of the columns corresponding to the candidates 4, 7, and 8, Cell 4 is excluded from the candidates, yielding C4[1]{7, 8}. For row 3, the maximum values in columns corresponding to the candidates are 4.8, therefore these cells are preserved as candidates, yielding C4[3]={6, 9} (FIGS. 34 through 38).

2-7. The center of gravity of each candidate is:

G7(1)=(4, 7)

G7(2)=(5, 5)

G7(3)=(7, 6)

G7(4)=(5, 3).

3-7. Evaluation values Aij are

TABLE 9

| 8.8 | 8.3 | 10.0 | 6.0 | 4.5 | 7.7 | 4.8 | 4.8 | 7.3 |
|---|---|---|---|---|---|---|---|---|
| 11.1 | 7.7 | 10.0 | 9.2 | 6.5 | 7.4 | 9.6 | 7.2 | 8.5 |
| 10.0 | 7.7 | 7.3 | 8.3 | 4.5 | 4.8 | 8.8 | 6.0 | 4.8 |
| 5.7 | 4.0 | 5.7 | 6.5 | 4.0 | 6.5 | 9.2 | 8.0 | 9.2 |

4-7. Solve the placement problem as described at the step 4-1, then S6={7, 5, 9, 2}.

5-7. The candidates are reduced.

Because the value in row 1 of Aij is 4.8 in columns corresponding to the candidates 7 and 8, these cells are preserved, yielding C7[1]={7, 8}. For row 3, the values in columns corresponding to the candidates 6 and 9 are 4.8, therefore these cells are preserved as candidates, yielding C7[3]={6, 9}. C7[2]={5} and C7[4]={2} are unchanged.

Because no more candidates can be reduced, the solution of the assignment problem, C[1]={7}, C[2]={5}, C[3]={6}, and C[4]={2}, is taken as the best solution of the placement problem. According to 5-7., C[1]={8} and C[3]={9} can also be the solution of the problem, therefore the following solutions are best solution (FIGS. 39 through 42).

C[1]={8}, C[2]={5}, C[3]={6}, C[4]={2}

C[1]={7}, C[2]={5}, C[3]={9}, C[4]={2}

C[1]={8}, C[2]={5}, C[3]={9}, C[4]={2}

The evaluation functions L of the placement are as follows:

$$La = Df(1, 7) + Df(2, 6) + Df(3, 2) +$$
$$1/2(D(7, 5) + D(5, 7) + D(5, 6) + D(5, 2) + D(6, 5) + D(2, 5))$$
$$= 2 + \sqrt{8} + 2 + 1/2(\sqrt{8} + \sqrt{8} + 2 + 2 + 2 + 2)$$
$$= 8 + 2\sqrt{8}$$

$$Lb = Df(1, 8) + Df(2, 6) + Df(3, 2) +$$
$$1/2(D(8, 5) + D(5, 8) + D(5, 6) + D(5, 2) + D(6, 5) + D(2, 5))$$
$$= \sqrt{8} + \sqrt{8} + 2 + 1/2(2 + 2 + 2 + 2 + 2 + 2)$$
$$= 8 + 2\sqrt{8}$$

$$Lc = Df(1, 7) + Df(2, 9) + Df(3, 2) +$$
$$1/2(D(7, 5) + D(5, 7) + D(5, 9) + D(5, 2) + D(9, 5) + D(2, 5))$$
$$= 2 + 2 + 2 + 1/2(\sqrt{8} + \sqrt{8} + \sqrt{8} + 2 + \sqrt{8} + 2)$$
$$= 8 + 2\sqrt{8}$$

$$Ld = Df(1, 8) + Df(2, 9) + Df(3, 2) +$$
$$1/2(D(8, 5) + D(5, 8) + D(5, 9) + D(5, 2) + D(9, 5) + D(2, 5))$$
$$= \sqrt{8} + 2 + 2 + 1/2(2 + 2 + \sqrt{8} + 2 + \sqrt{8} + 2)$$
$$= 8 + 2\sqrt{8}$$

Thus, all evaluation functions provide the same value.

Advantages of the Invention

As described above, the present invention allows the placement of components to be performed which minimize computational complexity and provides a high evaluation value rapidly.

What is claimed is:

1. A component placement method performed on a component placement apparatus storing a plurality of position information items of a plurality of cells and a plurality of inter-component connection information items about connections between predetermined components in a plurality of components, each of which is placed in one of said cells, comprising steps of:

(a) calculating an evaluation value for each of said components in each of cells included in the current candidate locations of each component;

(b) calculation an evaluation value for each of said components in each of cells included in the current candidate locations according to said inter-component connection information;

(c) determining whether the reduction of said candidate for the location of one of said plurality of components is possible according to said evaluation value calculated at the step (b);

(d) repeating the steps (a) through (d) if it is determined at the step (c) that the reduction of said candidate for the location of any of said components is possible; and (e) arranging said plurality of components according to the current candidate location if it is determined at the step (c) that the reduction of said candidates for the location of said components is not possible.

2. A component placement method performed on a component placement apparatus storing a plurality of position information items of a plurality of cells, a plurality of inter-component connection information items about connections between predetermined components in a plurality of components, each of which is placed in one of said cells, and a plurality of information items about connections between a component fixed at a predetermined position and a predetermined component in said plurality of components, comprising steps of:

(a) calculation the center of gravity for each of components according to current candidates for the location of each component:

(b) calculation an evaluation value for each of said components in each of cells included in the current candidate locations according to said inter-component connection information and said fixed-component connection information;

(c) determining whether the reduction of said candidate for the location of one of said plurality of components is possible according to said evaluation value calculated at the step (b);

(d) repeating the steps (a) through (d) if it is determined at the step (c) that the reduction of said candidate for the location of any of said components is possible;

(e) arranging said plurality of components according to the current candidate location if it is determined at the step (c) that the reduction of said candidates for the location of said components is not possible.

3. A component placement apparatus for storing a plurality of position information items of a plurality of cells and a plurality of inter-component connection information items about connections between predetermined components in a plurality of components, each of which is placed in one of said cells, comprising:

(a) a first calculator for calculation the center of gravity for each of components according to current candidates for the location of each component;

(b) a second calculator for calculation an evaluation value for each of said components in each of cells included in the current candidate locations according to said inter-component connection information;

(c) a determining means for determining whether the reduction of said candidates for the location of one of said plurality of components is possible according to said evaluation value calculated be said second calculator;

(d) a repeating means for activating said first and second calculator, said determining means and said repeating means if it is determined by the determining means that the reduction of said candidates for the location of any of said components is possible; and (e) an arranging means for arranging said plurality of components according to the current candidate locations if it is determined by the determining means that the reduction of said candidates for the location of said components is not possible.

4. A storage medium containing a component placement control program executed on a component placement apparatus storing a plurality of position information items of a plurality of cells and a plurality of inter-component connection information items about connections between predetermined components in a plurality of components, each of which is placed in one of said cells, said program comprising:

(a) a program code for instructing said component placement apparatus to calculate the center of gravity for each of components according to current candidates for the location of each component;

(b) a program code for instructing said component placement apparatus to calculate an evaluation value for each of said components in each of cells included in the current candidate locations according to said inter-component connection information;

(c) a program code for instructing said component placement apparatus to determine whether the reduction of said candidate locations for one of said plurality of components is possible according to said evaluation value calculated by the execution of said program code (b);

(d) a program code for instructing said component placement apparatus to repeat to execute said program codes (a) through (d) if it is determined by the execution of said program code (c) that the reduction of said candidate for the location of any of said components is possible; and (e) a program code for instructing said component placement apparatus to arrange said plurality of components according to the current candidate locations if it is determined by the execution of said program code (c) that the reduction of said candidates for the location of said components is not possible.

5. A storage medium containing a component placement control executed on a component placement apparatus storing a plurality of position information items of a plurality of cells, a plurality of inter-component connection information items about connections between predetermined components in a plurality of components, each of which is placed in one of said cells, and a plurality of information items about connections between a component fixed at a predetermined position and a predetermined component in said plurality of components, said program comprising:

(a) a program code for instructing said component placement apparatus to calculate the center of gravity for each of components according to current candidates for the location of each component;

(b) a program code for instructing said component placement apparatus to calculate an evaluation value for each of said components in each of cells included in the current candidate locations according to said inter-component connection information and said fixed-component connection information;

(c) a program code for instructing said component placement apparatus to determine whether the reduction of said candidate for the location of one of said plurality of components is possible according to said evaluation value calculated by the execution of said program code (b);

(d) a program code for instructing said component placement apparatus to repeat to execute said program codes (a) through (d) if it is determined by the execution of said program code (c) that the reduction of said candidates for the location of any of said components is possible;

(e) a program code for instructing said component placement apparatus to arrange said plurality of components according to the current candidate locations if it is determined by the execution of said program code (c) that the reduction of said candidates for the location of said components is not possible.

* * * * *